US010714697B1

(12) United States Patent
Baca et al.

(10) Patent No.: US 10,714,697 B1
(45) Date of Patent: Jul. 14, 2020

(54) PEROVSKITE NANOCRYSTAL DEPOSITS

(71) Applicant: The United States of America, as represented by the Secretary of the Navy, Arlington, VA (US)

(72) Inventors: Alfred J. Baca, Ridgecrest, CA (US); John Stenger-Smith, Ridgecrest, CA (US); M. Joseph Roberts, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 12 days.

(21) Appl. No.: 16/240,908

(22) Filed: Jan. 7, 2019

(51) Int. Cl.
*H01L 51/00* (2006.01)
*H01L 51/42* (2006.01)
*C07F 7/24* (2006.01)

(52) U.S. Cl.
CPC ........ *H01L 51/009* (2013.01); *H01L 51/0007* (2013.01); *H01L 51/0028* (2013.01); *H01L 51/42* (2013.01); *C07F 7/24* (2013.01)

(58) Field of Classification Search
CPC .............. H01L 51/009; H01L 51/0007; H01L 51/0028; H01L 51/42; C07F 7/24
USPC .......................................................... 257/40
See application file for complete search history.

(56) References Cited

U.S. PATENT DOCUMENTS

| | | | |
|---|---|---|---|
| 2017/0243699 A1* | 8/2017 | Beaumont | H01G 9/2031 |
| 2017/0250030 A1* | 8/2017 | Druffel | H01L 51/4226 |
| 2018/0114649 A1* | 4/2018 | Ng | H01G 9/2018 |
| 2019/0259962 A1* | 8/2019 | Lee | C01G 21/16 |

* cited by examiner

*Primary Examiner* — Tu-Tu V Ho
(74) *Attorney, Agent, or Firm* — Naval Air Warfare Center Weapons Division; Matthew D. Pangallo

(57) ABSTRACT

A method for making a nanostructure includes preparing a perovskite precursor in a solvent where the perovskite concentration ranges from about 0.5M to about 1.5M. A substrate is coated in the perovskite precursor, and the perovskite precursor is annealed onto the substrate, thereby forming the nanostructure including the substrate with perovskite nanocrystal deposits.

17 Claims, 10 Drawing Sheets

US 10,714,697 B1

PEROVSKITE NANOCRYSTAL DEPOSITS

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

BACKGROUND

Perovskite is a mineral with a general formula of $ABX_3$ where A is a larger 2+ metal cation, B is a smaller 4+ metal cation, and X is an anion. Perovskite has unique light absorbing properties, as well as unique optical and electronic properties. Some of the unique properties of perovskite include superconductivity, magnetoresistance, and ferroelectricity. In addition, many different elements can be combined together to form perovskite structures. As a result, is used in a variety of applications including photovoltaics, lasers, light-emitting diodes, and photoelectrolysis

BRIEF DESCRIPTION OF THE DRAWINGS

Features and advantages of examples of the present disclosure will be apparent by reference to the following detailed description and drawings, in which like reference numerals correspond to similar, though perhaps not identical, components. Reference numerals or features having a previously described function may or may not be described in connection with other drawings in which they appear.

DETAILED DESCRIPTION

Figure 1:
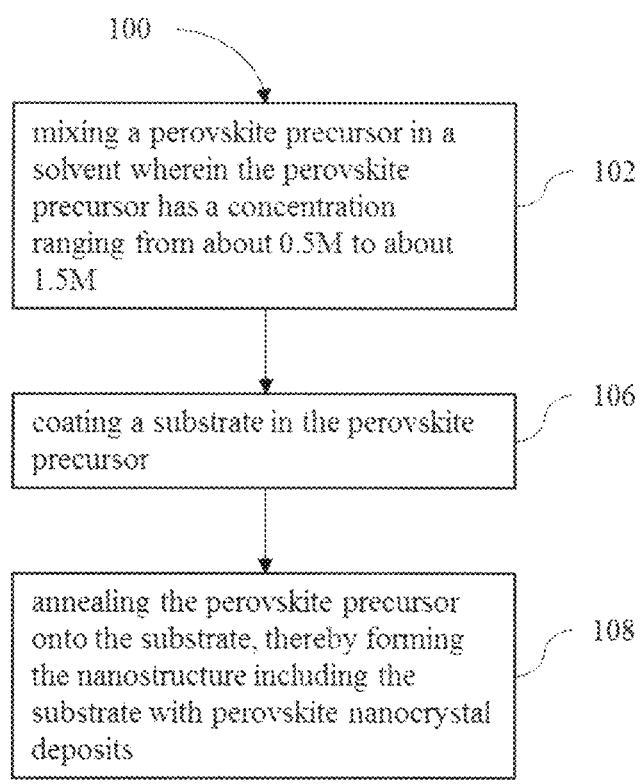
FIG. 1 is a flow diagram illustrating an example of a method for making a nanostructure described herein.

Generally, when forming perovskite nanocrystals on a substrate, the surface wettability and surface functionality of the substrate determine whether the perovskite nanocrystals will grow in a manner to produce a functional photovoltaic device. For example, during solar cell fabrication, typically a self-assembled monolayer (SAM) is applied to the substrate prior to adding the perovskite nanocrystals to create a hydrophobic surface. The hydrophobic surface allows the perovskite nanocrystals to grow on the surface of the substrate without destroying the functionality of the nanocrystals or the surface of the substrate. However, the few alternative methods available for growing perovskite nanocrystals on a substrate require specific substrates or specific perovskite precursors. As a result, for commonly used substrates, when the substrate's surface cannot be functionalized, there is no method for growing perovskite nanocrystals in a manner to produce a functional photovoltaic device.

Furthermore, SAMs are also used in order to grow the perovskite nanocrystals in a specific pattern. For example, a hydrophilic substrate may be used and hydrophobic SAMs may be added to specific locations on the substrate to grow perovskite nanocrystals on the hydrophobic SAMs in a specific pattern. In other examples, a thin film or layer of perovskite nanocrystals is grown on a hydrophobic surface, which can be patterned using soft lithographic patterning techniques directly on the perovskite nanocrystal film or layer. However, there is no method to grow perovskite nanocrystals in a specific pattern directly on a substrate without SAMs or patterning a perovskite nanocrystal film or layer after growth.

In the present disclosure, a method for making a nanostructure including a substrate with perovskite nanocrystal deposits grown directly on a substrate without any surface functionalization is provided. The method can be used to form non-patterned and patterned perovskite nanocrystal deposits directly on a substrate without growing a perovskite film or layer. Therefore, the method herein does not require any SAMs prior to forming the perovskite nanocrystal deposits on the substrate.

In addition, the method herein allows perovskite nanocrystal deposits to be grown on well defined, patterned substrates without SAMs. The method herein forms nanostructures including perovskite nanocrystal deposits, rather than perovskite nanocrystal layers or films, that grow in specific locations. As a result, the perovskite nanocrystal deposits do not require any patterning technique after growth onto the substrate. Furthermore, the methods herein also control the amount and morphology of the perovskite nanocrystal deposits that form on the patterned substrate.

The disclosure herein includes a method for making a nanostructure. In an example, the method includes mixing a perovskite precursor in a solvent with a perovskite concentration ranging from about 0.5M to about 1.5M. The perovskite precursor is coated and annealed onto the substrate, thereby forming the nanostructure including the substrate with perovskite nanocrystal deposits on the substrate.

Referring to FIG. 1, the method 100 for making a nanostructure includes the step 102 of mixing a perovskite precursor in a solvent. Mixing the perovskite precursor allows the precursor to be applied and annealed to patterned and non-patterned substrates. The perovskite precursor and solvent may be mixed until the perovskite precursor is completely dissolved in the solvent. In an example, the perovskite precursor is prepared by mixing the perovskite precursor in a solvent for about one minute. In some examples, the perovskite precursor may be prepared in a glove box depending on the solvent that is used.

The perovskite precursor may be any perovskite precursor that can form perovskite nanocrystals. In particular, any lead halide perovskite precursors may be used. Some examples include methylammonium lead halide perovskite (e.g., $PbMAI_3$, $PbMACl_2$, $PbMABr_2$), methylammonium germanium halide perovskite (e.g., $MAGeCl_2$, $MAGeBr_2$), methyl ammonium tin halide perovskite (e.g., $MASnCl_2$, $MASnBr_2$), formamidinium iodide halide perovskite (e.g., $FAICl$, $FAIBr$), formamidinium germanium halide perovskite, formamidinium tin halide perovskite, a perovskite nanocomposite, such as BAMPPV, which is perovskite and the polymer poly(2,5-bis(N-methyl-N-hexylamino)phenylene vinylene), and combinations thereof. The perovskite concentration of the perovskite precursor ranges from about 0.5M to about 1.5M. The perovskite concentration is directly correlated to the amount of perovskite nanocrystals that can be grown. For example, a higher concentration of perovskite in the perovskite precursor produces more individual perovskite nanocrystals in the deposits. Additionally, the morphology of the perovskite nanocrystals may vary depending on the perovskite precursor that is used. For example, $PbMAI_3$ precursor produces smooth, finer nanocrystals in the deposits while BAMPPV produces larger, cube-like nanocrystals.

The solvent may be any solvent that the perovskite precursor is soluble in. The solvent allows the perovskite precursor to be coated and annealed directly onto patterned and non-patterned substrates. Some examples of the solvent include dimethyl formamide, dimethyl sulfoxide, and combinations thereof.

Referring back to FIG. 1, method 100 for making a nanostructure includes step 104 of coating a substrate in the perovskite precursor. Depending on the coating process and the amount of perovskite nanocrystals formed, the location of the perovskite nanocrystal formation on the substrate can vary. Some examples of coating the substrate include spin coating or dipping the substrate in the perovskite precursor.

When spin coating is used, the perovskite precursor can be spin coated onto the substrate at a speed ranging from about 2000 RPM to about 5000 RPM. In some examples, a higher speed during spin coating may result in less perovskite nanocrystals forming on the substrate. In another example, a higher speed during spin coating may result in perovskite nanocrystals forming in certain locations on the substrate, such as one side of nanowells on a substrate, rather than filling entire nanowells.

The substrate may be a non-patterned or patterned hydrophobic substrate that can withstand 400° C. during sintering when forming the substrate. Some examples of substrates include non-patterned $TiO_2$, patterned $TiO_2$, non-patterned indium doped tin oxide, patterned indium doped tin oxide, and combinations thereof. When the structure is patterned, the pattern may be nanoimprinted nanowells, grated lines, a square array of nanoholes, and combinations thereof. In an example, the nanoimprinted nanowells have a diameter equal to or greater than about 500 nm and a depth equal to or greater than about 130 nm.

For non-patterned substrates, it is to be understood that non-patterned refers to a non-regular patterned substrate. For example, the substrate is prepared similar to a patterned substrate, however, a higher temperature (e.g., 90° C.) is applied when the substrate is stamped to create a pattern. As a result, the solvent evaporates quickly, which causes cracks and breaks along the length of the stamp. This causes the formation of islands on the substrate, thereby forming the non-patterned substrate using a patterned stamp.

In some examples of the method herein, the perovskite deposits can be formed on specific locations of the substrate. For example, when a substrate with nanoimprinted nanowells is used, the perovskite deposits can be formed only within each individual nanowell. In other examples, the perovskite deposits can be formed on one sidewall of the nanoimprinted nanowell. In other examples, the perovskite nanocrystal deposits are formed inside the grated lines of the substrate or within the nanoholes of the substrate.

Referring back to FIG. 1, method 100 for making a nanostructure includes the step 106 of annealing the perovskite precursor onto the substrate, thereby forming the nanostructure including the substrate with perovskite nanocrystal deposits. In one example, the perovskite precursor is annealed onto the substrate by heating the perovskite precursor on the substrate to a temperature ranging from about 110° C. to about 150° C. for a time of about 60 minutes.

In another example, the step 106 further includes removing the solvent from the perovskite precursor prior to annealing the perovskite precursor onto the substrate. The solvent may be removed by heating and exposing the substrate with the perovskite precursor to methyl ammonium iodide. In an example, the solvent may be removed by heating the perovskite precursor on the substrate to a temperature of about 70° C. for a time equal to or greater than 3 minutes and then exposing the substrate with the perovskite precursor to methyl ammonium iodide.

Once the perovskite nanocrystal deposits are annealed onto the substrate, a nanostructure is formed. The nanostructure consists of a substrate including perovskite nanocrystal deposits. The perovskite nanocrystal deposits can be formed from any of the perovskite precursors previously described herein. In addition, the substrate can be any substrate previously described herein. It is to be understood that the nanostructure formed herein does not include any self-assembled monolayers (SAMs). In some examples, the nanostructure formed can be a photovoltaic device, a photodiode, an x-ray sensing or detection device, or image sensor arrays.

To further illustrate the present disclosure, examples are given herein. It is to be understood that these examples are provided for illustrative purposes and are not to be construed as limiting the scope of the present disclosure.

EXAMPLES

The solutions of each material were dissolved in reagent grade and anhydrous solvents of dimethyl formamide (DMF) and chlorobenzene (CB). Scanning electron microscopy (SEM) and energy dispersive spectroscopy (EDS) spectra of the samples were taken at 20 kV accelerating voltage on a Zeiss EVO50-EP SEM with energy dispersive spectroscopy (EDAX) system. Emission spectra were collected using a confocal microscope (Witec alpha-SNOM) with matching objective lenses (60×, NA 0.8). Emission was excited with a 405 nm wavelength laser diode (OZ Optics) focused on the sample with the lower objective. Emission from the sample collected by the upper objective was passed through long pass and order-sorting filters then coupled to an optical fiber connected to an avalanche photodetector or a microspectrograph (Ocean Optics). Transmission spectra were measured using a confocal microscope (Witec alpha-SNOM) with matching objective lenses (60×, NA 0.8). Broadband light from a tungsten bulb was focused on the sample with the lower objective. Light transmitted by the sample was collected by the upper objective and focused on an optical fiber connected to a microspectrograph (Ocean Optics). The spectra obtained covered wavelengths from 400 to 825 nm.

Example 1: Producing Soft Nanoimprint Titanium Dioxide Thin Films

Titanium isopropoxide was mixed with concentrated HCl (few drops) in 200 proof ethanol to create the $TiO_2$ sol gel. PDMS stamps used for soft nanoimprinting were formed. A photolithographically patterned master is replicated by using a two-layered PDMS stamp composed of hard PDMS and soft PDMS. Bare glass slides and ITO coated glass slides were cleaned by rinsing in acetone, isopropanol, and DI water and subsequently dried with $N_2$ gas. The cleaned glass slide was placed on a hotplate at 50° C. and a few drops of the $TiO_2$ sol gel are added onto the glass slide. A PDMS stamp was placed into conformal contact with the $TiO_2$ sol gel droplets and allowed to dry on the hotplate. Once the solution evaporates the PDMS stamp is carefully removed, and the $TiO_2$ imprinted films were then sintered at 400° C. on a hotplate in a nitrogen atmosphere completing the fabrication process.

Example 2: Fabrication Process on a Patterned Substrate

Figures 2A, 2B, 2C:
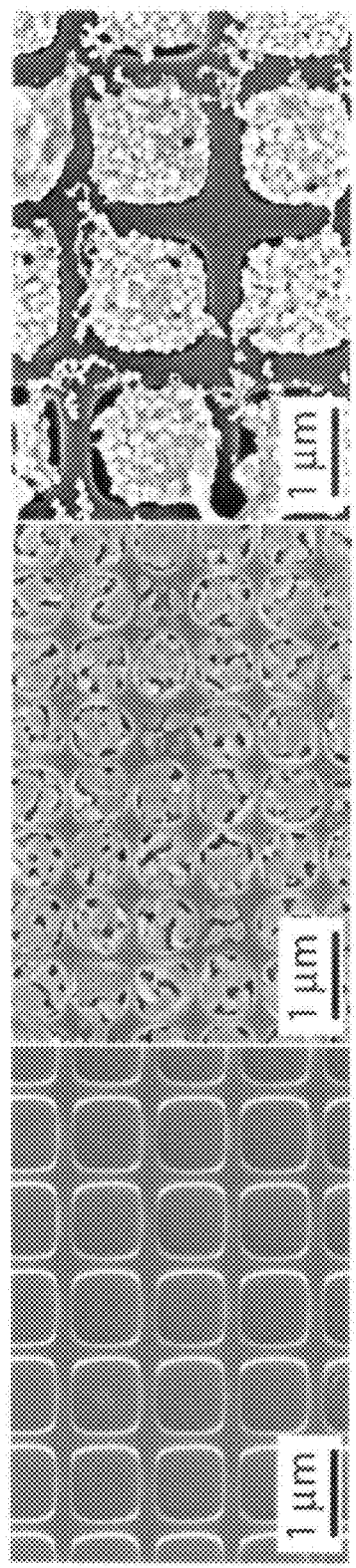
FIG. 2A-2C are SEM images of an example of each step of the method for making a nanostructure described herein.

In this example, for FIG. 2A and FIG. 2B, the nanostructure was produced using a $PbMAI_3$/BAMPPV method. In this method, stock solutions of 1M $PbI_2$ solution in DMF, 1M $PbI_2$ mixed with 1.5M methyl ammonium iodide solution in DMF, and 10 mg ml$^{-1}$ BAMPPV in CB were all prepared in a glovebox using anhydrous solvents. For the nanocomposite perovskite/polymer $PbMAI_3$/BAMPPV growth, a solution of 200 µl of 1M $PbI_2$ solution in DMF was mixed with 100 µl of 10 mg ml-1 BAMPPV in CB in a vial and mechanically mixed for 1 minute. The as-prepared solution was then subsequently drop cast onto a nanoimprinted $TiO_2$ glass substrate prepared as previously described herein and spin coated at 2000 RPM. The sample was then dried at 70° C. for 3 minutes and exposed to a 10 mg ml$^{-1}$ solution of methyl ammonium iodide (in 2-propanol) for 30 seconds.

FIGS. 2A-2C show SEM images of each fabrication step with different nanowell designs to produce different nanostructures described herein. FIG. 2A shows a SEM image of a template with nanowells produced using the method previously described herein. FIG. 2B shows nanowells with $PbI_2$ perovskite precursor inside the nanowells after spin coating and prior to annealing the perovskite precursor onto the substrate. The precursor tends to assemble inside the nanowells of the nanostructures as shown in FIG. 2B, which leads to the growth of perovskite nanocrystals in a bottom-up fashion. The morphology of this material was platelet-like and consistent with that of $PbI_2$ nanoplatelets formed during thin film spin coat processing. The height of the nanowells varied between about 114 nm to about 142 nm.

In FIG. 2C, the nanostructure was produced using a one-step $PbMAI_3$ method. A solution composed of 1M $PbI_2$ and 1.5M methyl ammonium iodide in DMF (200 µl), applied to a nanoimprinted $TiO_2$ glass substrate as previously described herein, and spin coated at 2000 RPM. To achieve growth of the perovskite nanocrystal deposits, the substrates were subsequently annealed at 110° C. for 60 minutes after the spin coating step. FIG. 2C shows the perovskite nanocrystal deposits on the nanostructure. Using the $PbMAI_3$, smaller crystals of perovskite were formed. The crystals grew inside the wells in a larger cluster compared to using the $PbMAI_3$/BAMPPV solution.

Figure 3:
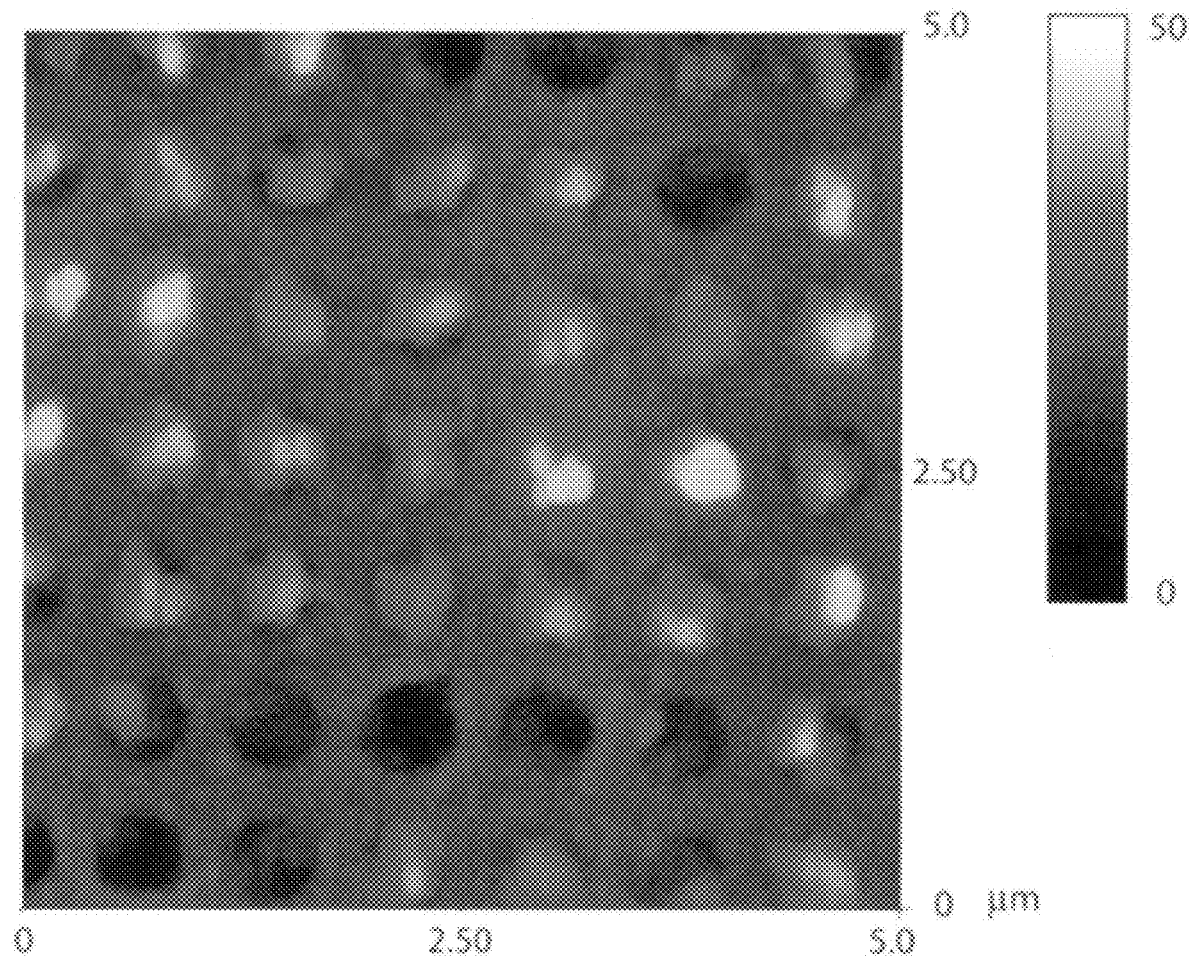
FIG. 3 is an AFM image of an example of nanostructure described herein.

To determine the height of the nanowells and the depth of the nanocrystal formation, an atomic force microscopy (AFM) image was taken. FIG. 3 shows the AFM image of the perovskite nanocrystals in the nanostructure produced using the $PbMAI_3$ method, which was previously stated to be between about 114 nm to about 142 nm.

Example 3: Fabrication Process on a Non-Patterned Substrate

In this example, in order to create a random array of cracks and islands across a $TiO_2$ substrate (i.e., a nonpatterned substrate) a non-regular patterned array route was used. In this approach a PDMS stamp with a grating pattern (2 µm×2 µm lines) was placed into conformal contact with a few drops of $TiO_2$ sol gel solution at 90° C. while placing pressure by hand. As a result, the solvent evaporated quickly and induced cracks and breaks along the length of the stamp. Using this approach leads to a random array of $TiO_2$ islands (formed by the cracks). For this example, the $PbMAI_3$/BAMPPV method was used by mixing a solution of $PbI_2$ with BAMPPV in CB, which was then spin coated on the substrate and exposed to a 10 mg ml$^{-1}$ solution of methyl ammonium iodide, and then heated at 110° C.

Figure 4:
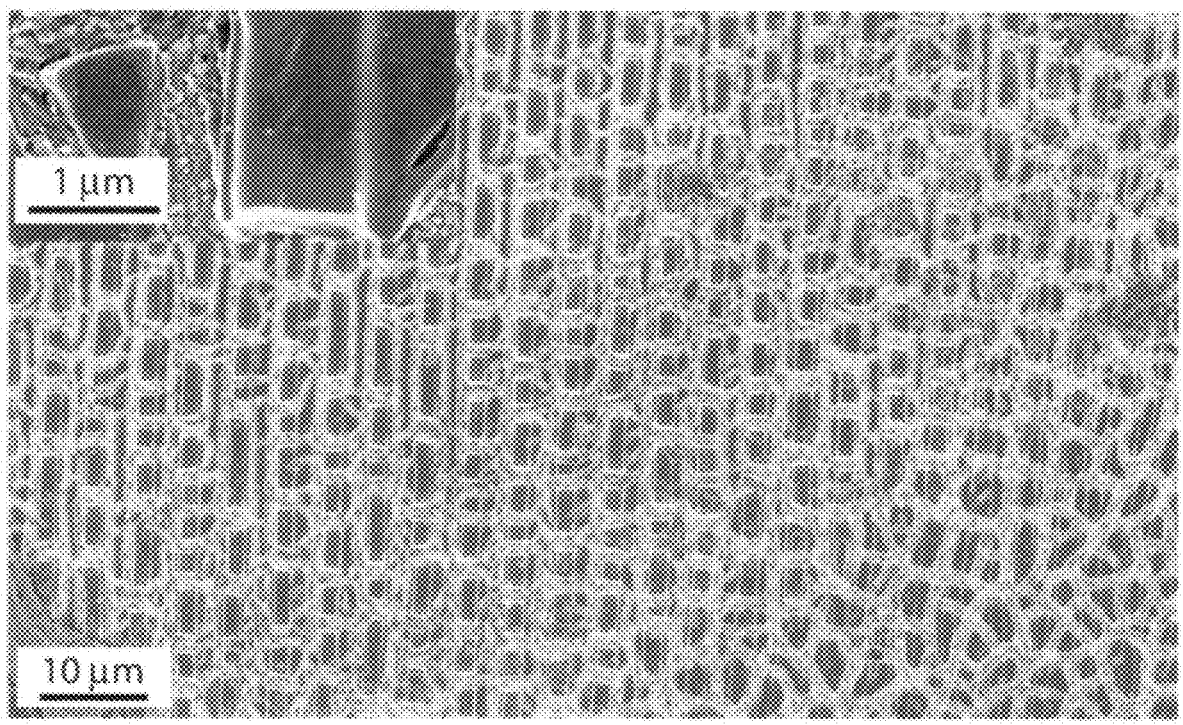
FIG. 4 is a SEM image of an example of a non-patterned substrate with perovskite nanocrystal deposits.

FIG. 4 shows a SEM image of the perovskite nanocrystal growth and spatial distribution mainly present outside the $TiO_2$ surfaces. The high resolution inset depicts the $TiO_2$ islands and the perovskite nanocrystal deposits around the island formation. The perovskite nanocrystal deposits grown with this approach are cube like and assemble into larger aggregates during the perovskite formation using the $PbMAI_3$/BAMPPV method. The amount (i.e. concentration) and volume of the precursor solution limits the amount of perovskite available for the growth step of the nanocrystals, and therefore this puts an upper limit on the amount of perovskite that can be applied.

Example 4: Selectively Growing Nanocrystals

In this example, a two-step method was used where 100 µl of CB were added to the 1M $PbI_2$ solution in DMF to form the perovskite precursor solution. The perovskite precursor was applied to different substrates, and spin coated at 2000 RPM. To achieve perovskite growth, the substrates were subsequently annealed at 110° C. for 60 min after the spin coating step.

Figure 5:
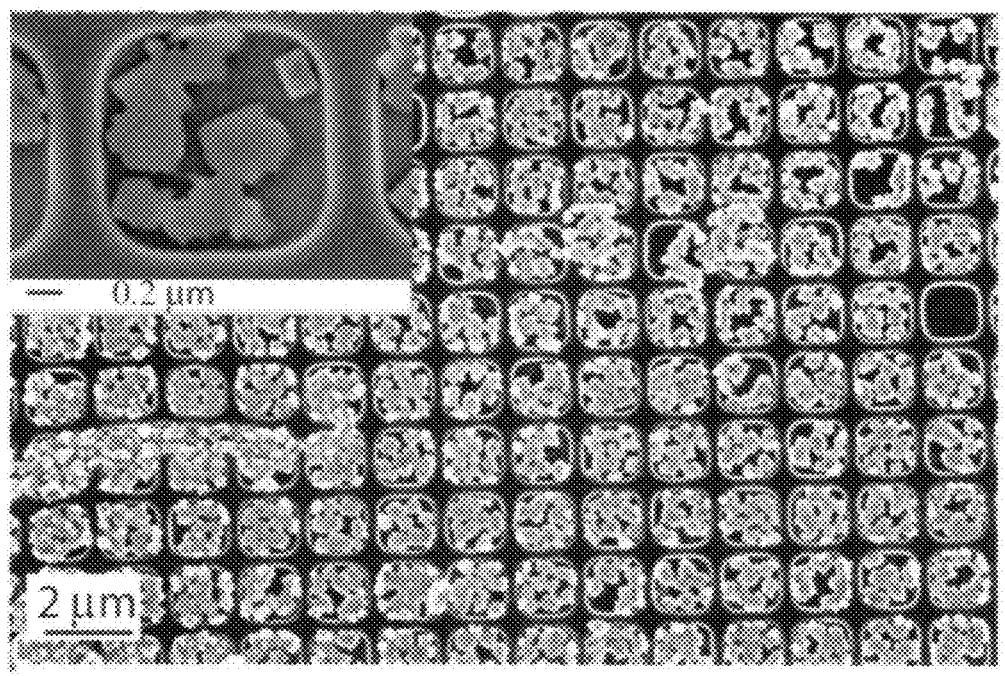
FIG. 5 is a SEM image of an example of a nanostructure including the substrate with perovskite nanocrystal deposits described herein.

In FIG. 5, the perovskite precursor was spin coated and annealed onto a nanowell imprinted $TiO_2$ substrate. The perovskite nanocrystals were selectively grown inside the nanowells using the BAMPPV precursor. FIG. 5 shows the SEM image of the perovskite nanocrystals selectively grown inside the nanowells.

Figure 6:
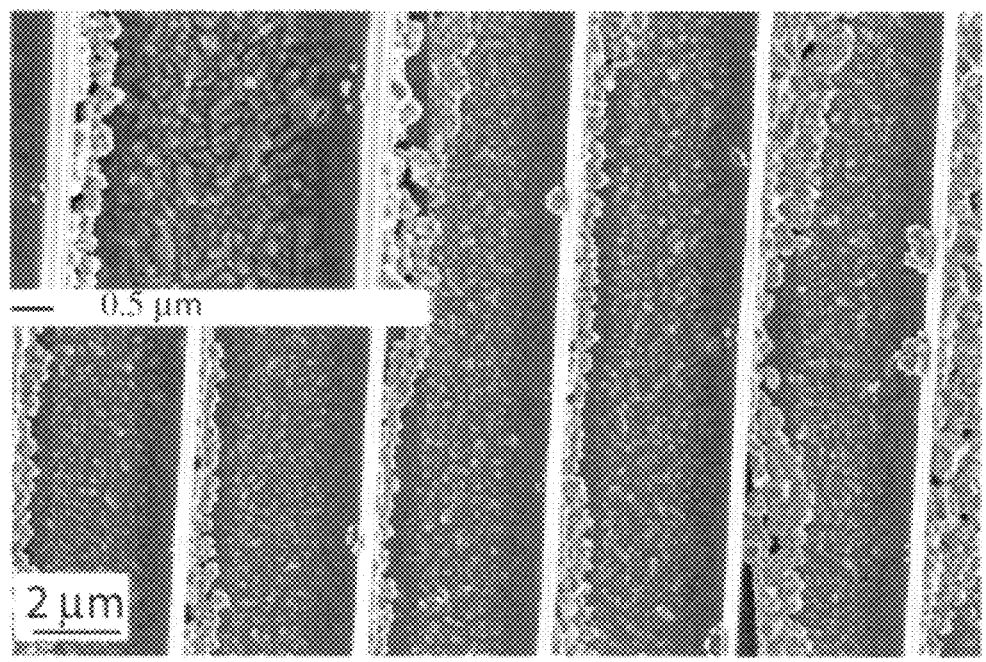
FIG. 6 is a SEM image of another example of a nanostructure including the substrate with perovskite nanocrystal deposits described herein.

FIG. 6 shows a SEM image of a $TiO_2$ substrate with nanoimprinted nanograting formed on an indium tin oxide glass substrate exposed to a perovskite BAMPPV solution. The nanograting lines shown in FIG. 6 depicts the preferential growth of the perovskite on a single side of the sidewall of $TiO_2$ nanograting substrate, further supporting that the patterning technique shown here was primarily due to a physical affect during the spin coating process causing the perovskite to selectively grow on a single side of the sidewall. The demonstration of this type of grown substrate has potential applications in lasing, with the use of different perovskite precursors. The spin coating approach presented herein used to assemble perovskite nanocrystals was robust and works on various sizes nanoholes (and micron sized holes), and other soft nanoimprinted template designs.

Figure 7:
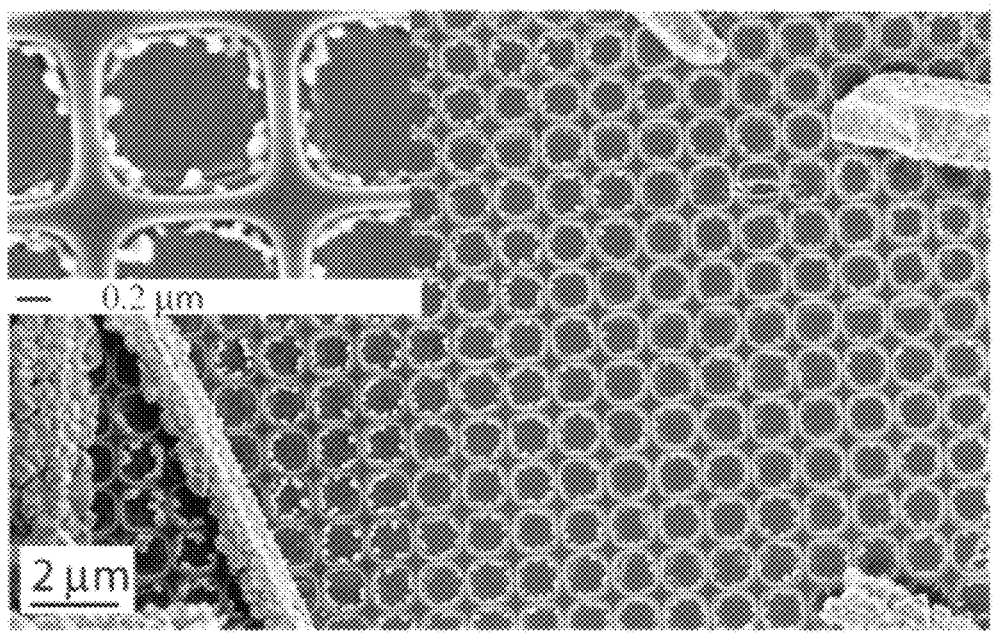
FIG. 7 is a SEM image of another example of a nanostructure including the substrate with perovskite nanocrystal deposits described herein.

FIG. 7 shows a SEM image of a $TiO_2$ substrate with a square nanowell imprint that was exposed to a $PbMAI_3$ precursor using the 2-step method previously described herein. However, in this example, a 100 µl of CB was added to 200 µl of perovskite PbI$_2$ precursor (dipped in methyl ammonium iodide and exposed to heat to finish the fabrication sequence). As seen from the high resolution SEM in FIG. 7, the perovskite nanocrystals grow inside the nanowells of the substrate. The morphology in this example is smoother compared to using BAMPPV as the perovskite precursor.

Figure 8:
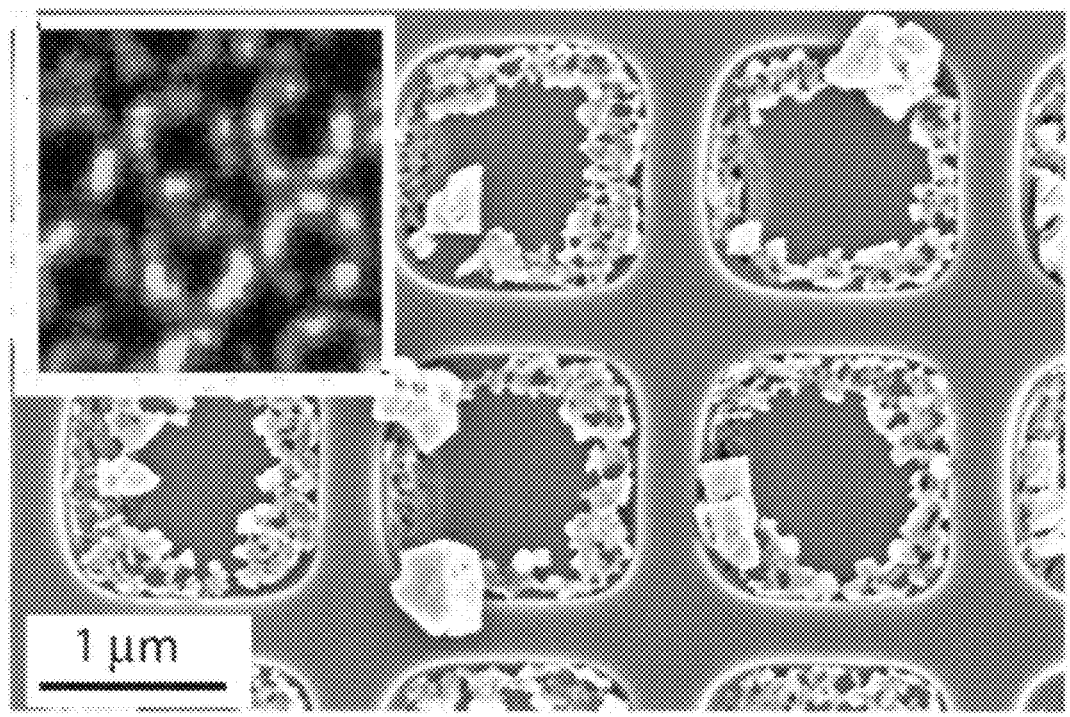
FIG. 8 is a SEM image of another example of a nanostructure including the substrate with perovskite nanocrystal deposits described herein.

FIG. 8 is a SEM image of a substrate with nanowells including PbMAI$_3$/BAMPPV nanocomposite perovskite nanocrystal deposits. The nanostructure was generated using PbMAI$_3$/BAMPPV growth method described herein in Example 2. Scanning confocal emission microscopy revealed the positional distribution of fluorescent perovskite crystals on the substrates in line with the walls of the nanowell imprints. The fluorescent emission indicated the perovskite crystals are pure MAPbI$_3$ not an intermediate solvent complex with similar morphology. The perovskite crystals in the nanowells strongly absorbed light across the visible spectrum. The transmission spectrum correlated with fully converted MAPbI$_3$.

Example 5: Photo-Response of a Photodiode

Figure 9A:
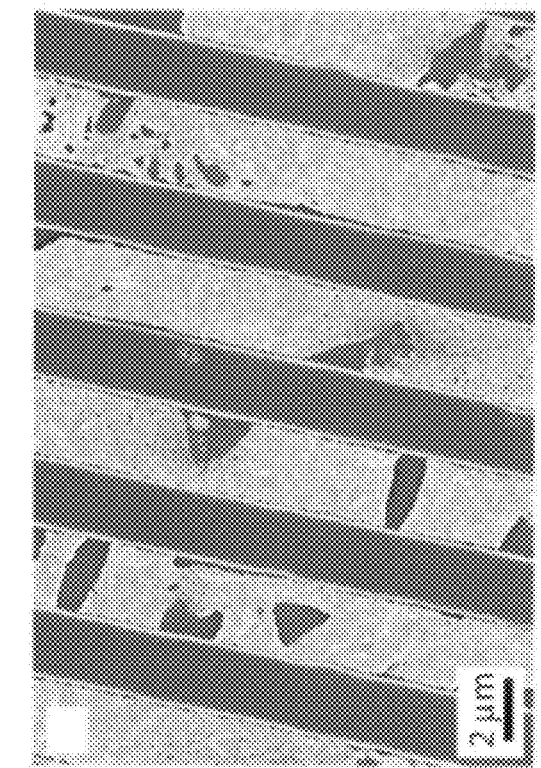
FIG. 9A is an AFM image of an example of nanostructure including the substrate with perovskite nanocrystal deposits described herein.
Figure 9B:
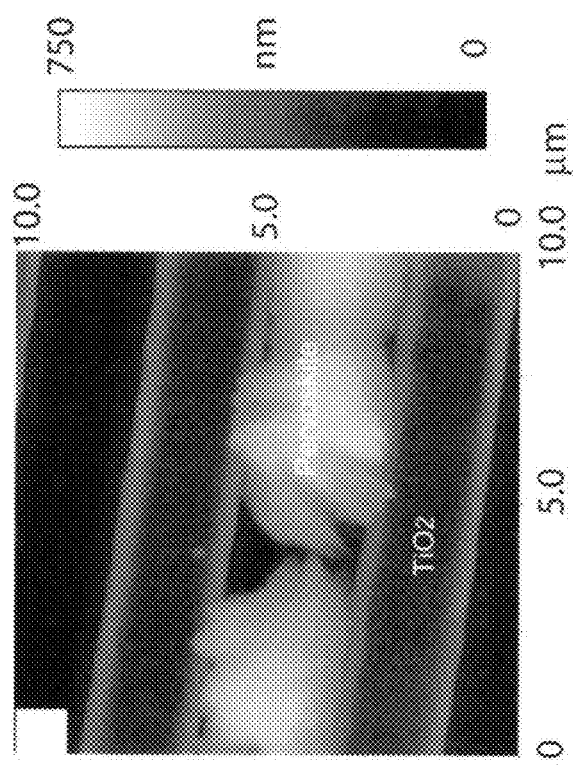
FIG. 9B is a SEM image of the same example shown in FIG. 9A.

To demonstrate a photo-response of a two terminal device, a photodiode was prepared using perovskite nanocrystals formed using the one-step PbMAI$_3$ method previously described herein. A TiO$_2$ grating substrate was prepared and used as the substrate. FIG. 9A shows an AFM image of the device layout used for the fabrication of the photodiodes. A TiO$_2$ grating substrate had a line width of about 2 µm. FIG. 9A shows the growth of the perovskite nanocrystals extends in a vertical direction several nanometers above the TiO$_2$ substrate surface (height of TiO$_2$ substrate surface is 130 nm). FIG. 9B is a SEM image of the same patterned device area.

Figure 10:
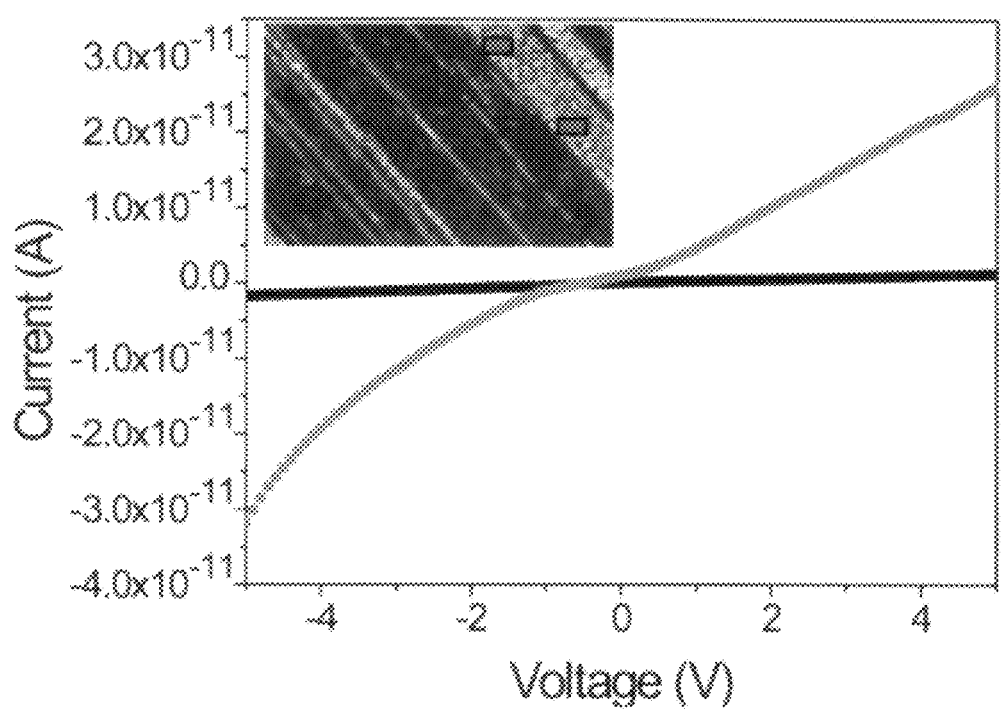
FIG. 10 is a plot illustrating the voltage (X-axis, labeled "Voltage (V)") vs. the current (Y-axis, labeled "Current (A)") of an example of the nanostructure shown in FIGS. 9A and 9B.

FIG. 10 shows a plot of the electrical characterization (light on and light off response) of the perovskite patterned array shown in FIGS. 9A and 9B. The light attached to the microscope of the signatone prober was used to control the light conditions or exposure. The inset depicts an optical micrograph of the probed area and the black and grey boxes show an area where electrical probes measured the perovskite nanomaterial. Typically, a strip of patterned perovskite nanocrystal area of about 20 µm×60 µm was probed for device measurement. No metal contacts were used. However, a sufficient photo-response was measured. As shown in FIG. 10, there is a low current output under light conditions, and current increases when exposed to light, which is consistent with perovskite materials used in a two terminal device layout.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Unless otherwise stated, any feature described herein can be combined with any aspect or any other feature described herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 110° C. to about 150° C. should be interpreted to include not only the explicitly recited limits of from about 110° C. to about 150° C., but also to include individual values, such as 113° C., 125° C., 135° C., etc., and sub-ranges, such as from about 115° C. to about 135° C., etc.

In describing and claiming the examples disclosed herein, the singular forms "a", "an", and "the" include plural referents unless the context clearly dictates otherwise.

What is claimed is:

1. A method for making a nanostructure, comprising:
   mixing a perovskite precursor in a solvent, wherein the perovskite precursor has a concentration ranging from about 0.5M to about 1.5M;
   coating a substrate in the perovskite precursor; and
   annealing the perovskite precursor onto the substrate, thereby forming the nanostructure including the substrate with perovskite nanocrystal deposits.

2. The method of claim 1, wherein the perovskite precursor is selected from the group consisting of methylammonium lead halide perovskite, a perovskite nanocomposite, methylammonium germanium halide perovskite, methylammonium tin halide perovskite, formamidinium iodide lead halide perovskite, formamidinium germanium halide perovskite, formamidinium tin halide perovskite, and combinations thereof.

3. The method of claim 1, wherein the solvent is selected from the group consisting of dimethyl formamide, dimethyl sulfoxide, and combinations thereof.

4. The method of claim 1, wherein the substrate is selected from the group consisting of a non-patterned TiO$_2$ structure, a patterned TiO$_2$ structure, non-patterned indium doped tin oxide, patterned indium doped tin oxide, and combinations thereof.

5. The method of claim 1, wherein coating the substrate includes spin coating or dipping the substrate in the perovskite precursor.

6. The method of claim 5, wherein the spin coating occurs at speed ranging from about 2000 RPM to about 5000 RPM.

7. The method of claim 1, further including removing the solvent from the perovskite precursor prior to annealing the perovskite precursor on the substrate.

8. The method of claim 7, wherein the solvent is removed by heating the perovskite precursor on the substrate at a temperature of about 70° C. for a time equal to or greater than 3 minutes and exposing the substrate to methyl ammonium iodide.

9. The method of claim 1, wherein annealing the perovskite precursor is performed by heating the perovskite precursor on the substrate at a temperature ranging about 110° C. to about 150° C. for a time of about 60 minutes.

10. A method for making a nanostructure, consisting of:
preparing a perovskite precursor in a solvent wherein the perovskite concentration ranges from about 0.5M to about 1.5M;
coating the substrate in the perovskite precursor; and
annealing the perovskite precursor on the substrate, thereby forming the nanostructure including the substrate with perovskite nanocrystal deposits.

11. A nanostructure, consisting of:
a substrate, wherein the substrate is selected from the group consisting of titanium dioxide, indium doped tin oxide and wherein the substrate is patterned, non-patterned, or a combination thereof; and
perovskite nanocrystal deposits formed directly on the substrate.

12. The nanostructure of claim 11, wherein the pattern is nanoimprinted nanowells, grated lines, a square array of nanoholes, and combinations thereof.

13. The nanostructure of claim 12, wherein the nanoimprinted nanowells have a diameter equal to or greater than about 500 nm and a depth equal to or greater than about 130 nm.

14. The nanostructure of claim 12, wherein the substrate includes nanoimprinted nanowells and the perovskite deposits are formed only in the each individual nanoimprinted nanowell of the substrate.

15. The nanostructure of claim 14, wherein the perovskite deposits are formed on one sidewall of the nanoimprinted nanowells.

16. The nanostructure of claim 11, wherein the perovskite nanocrystal deposits are formed from a precursor selected from the group consisting of methylammonium lead halide perovskite, a perovskite nanocomposite, methylammonium germanium halide perovskite, methylammonium tin halide perovskite, formamidinium iodide lead halide perovskite, formamidinium germanium halide perovskite, formamidinium tin halide perovskite, and combinations thereof.

17. The nanostructure of claim 11, wherein the nanostructure formed is a part of a photodiode.

* * * * *